United States Patent
Lu et al.

(10) Patent No.: US 8,816,753 B2
(45) Date of Patent: Aug. 26, 2014

(54) TRIM CIRCUIT FOR POWER SUPPLY CONTROLLER

(75) Inventors: Rui-Hong Lu, Shuishang Township, Chiayi County (TW); Han-Chung Tai, Kaohsiung (TW); Hsin-Chih Chiang, Hsinchu (TW)

(73) Assignee: System General Corp., New Taipei (TW)

( * ) Notice: Subject to any disclaimer, the term of this patent is extended or adjusted under 35 U.S.C. 154(b) by 0 days.

(21) Appl. No.: 13/073,862

(22) Filed: Mar. 28, 2011

(65) Prior Publication Data
US 2012/0249220 A1    Oct. 4, 2012

(51) Int. Cl.
*H01H 37/76* (2006.01)
*G11C 17/18* (2006.01)

(52) U.S. Cl.
CPC ................................. *G11C 17/18* (2013.01)
USPC ........................................................ 327/525

(58) Field of Classification Search
USPC ........................................................ 327/525
See application file for complete search history.

(56) References Cited

U.S. PATENT DOCUMENTS

| | | | |
|---|---|---|---|
| 6,388,853 B1 | 5/2002 | Balakrishnan et al. | |
| 7,687,883 B2 | 3/2010 | Fifield et al. | |
| 7,714,408 B2 | 5/2010 | Tokunaga | |
| 7,715,219 B2 | 5/2010 | Monreal | |
| 7,728,390 B2 | 6/2010 | Kuo et al. | |
| 8,258,856 B2 * | 9/2012 | Lee et al. | 327/525 |
| 2004/0071007 A1 | 4/2004 | Pecheyran et al. | |
| 2008/0186789 A1 * | 8/2008 | Sumi et al. | 365/225.7 |
| 2010/0134175 A1 | 6/2010 | Lee et al. | |

OTHER PUBLICATIONS

Chinese language office action dated Jun. 5, 2012.
TW Office Action dated Dec. 17, 2013.

* cited by examiner

*Primary Examiner* — Sibin Chen
(74) *Attorney, Agent, or Firm* — McClure, Qualey & Rodack, LLP

(57) ABSTRACT

A trim circuit for a power supply controller includes: a control circuit; at least a capacitance type programmable circuit connection; and a switching circuit, under control of the control circuit, the switching circuit selectively coupling the capacitance type programmable circuit connection to anyone of an operation voltage and a programming voltage, for determining a programming state of the capacitance type programmable circuit connection.

5 Claims, 3 Drawing Sheets

US 8,816,753 B2

TRIM CIRCUIT FOR POWER SUPPLY CONTROLLER

BACKGROUND OF THE DISCLOSURE

1. Technical Field

The disclosure relates in general to a trim circuit for a power supply controller and more particularly to a trim circuit having a capacitance type programmable circuit connection.

2. Background

Electronic devices use power to operate. During conversion, a low frequency (e.g. 50 Hz or 60 Hz) programming voltage alternating current (AC) is converted to programming voltage direct current (DC); the programming voltage DC is converted to high frequency (e.g. 30 to 300 kHz) AC; this high frequency programming voltage AC is transformed (by for example a transformer) to a lower voltage to provide safety isolation. The output of the transformer is rectified to provide a regulated DC output, which may be used to power an electronic device.

In order to compensate process variations, analog integrated circuits such as power supply controllers in the power supply may be commonly trimmed for critical parameters. Trim may be used for wafer sorting (i.e. wafer leveling) or at IC level.

During wafer sorting, the power supply controller may be trimmed using trim pads on the wafer before being assembled in plastic packages. Trimming is done at the wafer level because the trim pads are not usually accessible after assembly. Besides, the assembled parts may be tested again at final test (FT) to eliminate parts shifted too much or damaged during assembly.

Programmable fuses and antifuses allow IC designers to "personalize," or custom configure, various circuits. A programmable fuse is in a close circuit connection if unprogrammed and in an open circuit connection if programmed. On the contrary, a programmable antifuse is in an open circuit connection if unprogrammed and in a close circuit connection if programmed. Generally, a programmable fuse comprises a fusible conductive link that is broken during programming so that the conductive link no longer closes the circuit. Programmable fuses are a laser programmable type or an electronically programmable type. In both types, the fusible conductive link is broken by heating the link sufficiently so as to melt the link. In the laser programmable type of fuse, a laser provides energy to melt the conductive link. In the electronically programmable type, a relatively large current is passed through the conductive link such that the resistive heating of the link causes the link to melt.

FIG. 1A shows a prior trim circuit. As shown in FIG. 1A, the sensing circuit 110 senses the voltage at node $N_1$ to output a logic signal $S_L$. The voltage of the node $N_1$ is corresponding to the state of the fuse 120. In initial fabricated state (i.e. normal state), the fuse 120 provides a low resistance connection or short circuit connection, so that the logic signal from the sensing circuit 110 is logic "0". After the fuse 120 is programmed, the fuse 120 provides a high resistance or open circuit connection, so the logic signal from the sensing circuit 110 turns to logic "1".

However, in prior art, in order to program the fuse 120 which may be metal or poly, a large current is required. FIG. 1B shows the current-voltage (I-V) curve for the prior fuse 120. As shown in FIG. 1B, in order to program the metal or poly fuse 120, the current must be large enough, for example 400~800 mA. This large current is provided by an external and large-size current source.

Further, in the prior trim circuit in FIG. 1A, in order to program/trim, each trim bit needs two trim pads 130A and 130B. The trim pad is large size, for example, 50 μm×50 μm. Further, an external large-size current source is also required to provide a large program current. Therefore, in the prior art, the trim circuit is large sized due to the large-size pads and the external large-size current source.

BRIEF SUMMARY OF THE DISCLOSURE

One example of the disclosure is directed to a trim circuit for a power supply controller, wherein in order to program a programmable circuit connection, a high programming voltage is enough. Thus, neither high external current nor external large-size current source is required. Further, no pad is required. Thus, the circuit size of the trim circuit is small.

According to a exemplary example of the present disclosure, a trim circuit for a power supply controller, includes: a control circuit; at least a capacitance type programmable circuit connection; and a switching circuit, under control of the control circuit, the switching circuit selectively coupling the capacitance type programmable circuit connection to any-one of an operation voltage and a programming voltage, for determining a programming state of the capacitance type programmable circuit connection.

It is to be understood that both the foregoing general description and the following detailed description are exemplary and explanatory only and are not restrictive of the disclosed embodiments, as claimed.

DETAILED DESCRIPTION OF THE DISCLOSURE

First Embodiment

A programmable antifuse is in an open circuit connection if unprogrammed and is in a close circuit connection if programmed. Usually, an antifuse has two conductive regions separated by an insulating region that electrically insulates the two conductive regions from one another. In its unprogrammed state of the antifuse, no current is allowed to pass from one conductive region to the other; and in other words, in its unprogrammed state of the antifuse, the antifuse is in the open circuit connection. When programmed, the insulating region is partially destroyed, allowing current to flow between the two conductive regions; and in other words, in its programmed state of the antifuse, the antifuse is in the short circuit connection. Programming an antifuse results conductive filament that extends within the insulating region between the two conductive regions.

In the embodiments of the disclosure, the antifuse is electronically programmable, i.e., programmable by charging with a high voltage to cause the insulating region to become at least partially conductive. One type of programmable antifuse disclosed by the embodiment of the disclosure is a capacitance antifuse.

Figure 1A:
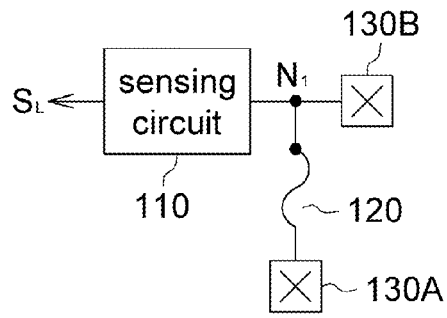
FIG. 1A (prior art) shows a prior trim circuit.
Figure 1B:
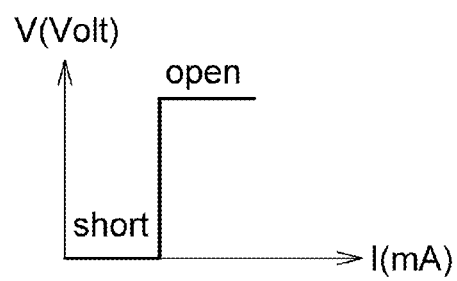
FIG. 1B (prior art) shows the current-voltage (I-V) curve for the prior fuse.
Figure 2A:
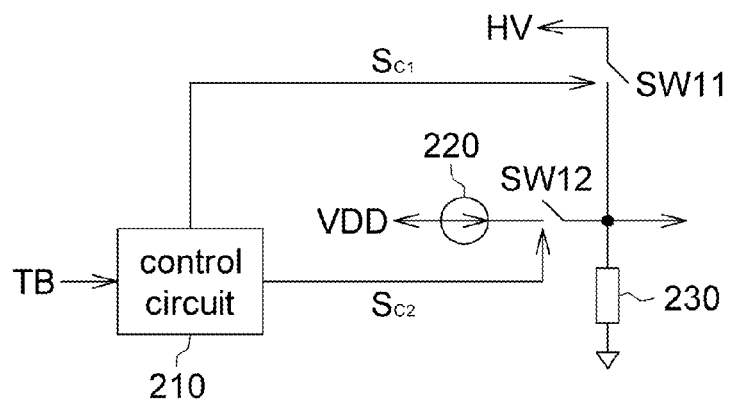
FIG. 2A shows a trim circuit according to a first embodiment of the disclosure.

FIG. 2A shows a trim circuit according to a first embodiment of the disclosure. The trim circuit according to the first embodiment includes a control circuit 210, a current source 220, a programmable circuit connection and switches SW11~12. In the embodiment, the programmable circuit connection 230 is, for example but not limited to, a capacitance type antifuse 230. O/P refers to an output terminal.

According to the trim bit TB, the control circuit 210 controls the conduction states of the switches SW11~12 by the control signals $S_{C1}$ and $S_{C2}$ and therefore determines the program state of the antifuse 230.

Figure 2B:
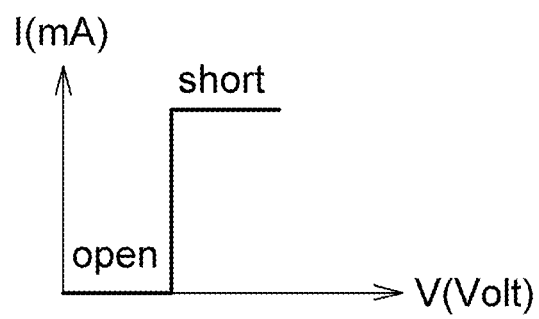
FIG. 2B shows a current-voltage (I-V) curve of the antifuse according to the first embodiment of the disclosure.
Figure 2C:
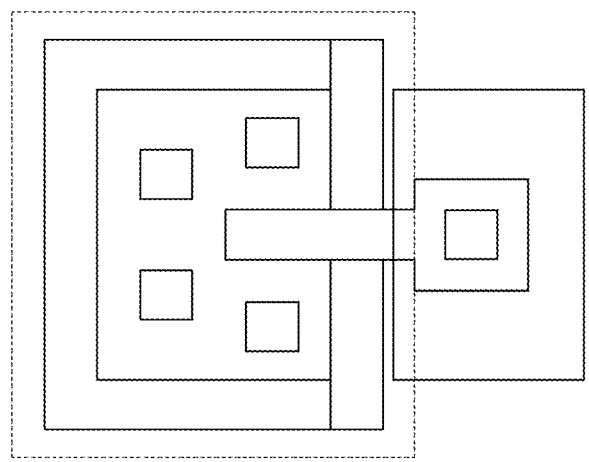
FIG. 2C shows a possible layout structure of the antifuse according to the first embodiment of the disclosure.

The current source 220 provides a constant current to the antifuse 230. The current source 220 is small size. The current-voltage (I-V) curve of the antifuse 230 is shown in FIG. 2B. As shown in FIG. 2B, in the first embodiment, the antifuse 230 is in open circuit connection (in permanent high resistance connection) when the voltage applied thereto is lower than a threshold value (for example but not limited to 20V). The antifuse 230 is programmed into the short circuit connection (in low resistance connection) when the voltage applied thereto is higher than the threshold value. FIG. 2C shows a possible layout structure of the capacitance type antifuse 230. Since it is a traditional layout of a capacitance, so the description is omitted here.

The switch SW11 is selectively coupled between the programming voltage HV and the antifuse 230; and the conduction state thereof is controlled by the control signal $S_{C1}$ from the control circuit 210. The switch SW12 is selectively coupled between the current source 220 and the antifuse 230 (i.e. the switch SW12 being coupled between the operation voltage VDD and the antifuse 230); and the conduction state thereof is controlled by the control signal $S_{C2}$ from the control circuit 210. The conduction states of the switches SW11~12 is opposite. In other words, when the switch SW11 is conducted, the switch SW12 is turned off and in an open state; and vice versa.

When the trim bit TB representing the antifuse 230 is unprogrammed (i.e. in open circuit connection), the control circuit 210 controls the switch SW12 in a conducted state (i.e. a turned on state) and the switch SW11 in a non-conducted state (i.e. a turned off state). The operation voltage VDD (for example but not limited to, 5V) is applied to the antifuse 230 via the conducted switch SW12 but the programming voltage HV (for example but not limited, higher than 20V) is not applied to the antifuse 230 because of the non-conducted switch SW11. Because the antifuse 230 is applied by 5V lower than the threshold value, the antifuse 230 is unprogrammed.

When the trim bit TB representing the antifuse 230 is to be programmed (i.e. in short circuit connection), the control circuit 210 controls the switch SW12 in the non-conducted state and the switch SW11 in the conducted state. The operation voltage VDD is not applied to the antifuse 230 but the programming voltage HV is applied to the antifuse 230 via the conducted switch SW11. Because the antifuse 230 is applied by the programming voltage HV (>25V) higher than the threshold value, the antifuse 230 is programmed. Further, after the antifuse 230 is programmed, the antifuse 230 becomes permanently shorted and no longer provides a high resistance connection.

Although FIG. 2A shows only one antifuse 230, the first embodiment is not limited. The trim circuit may include a plurality of parallel antifuses 230 and the program state of each antifuse is independently controlled by the control circuit 210.

Further, each critical parameter for the power supply controller may be trimmed to the desired accuracy by allocating a number of programmable circuit connections to that parameter. When more than one programmable circuit connection is assigned to the same critical parameter, each programmable circuit connection trim is designed to have different weight affecting the critical parameter. Thus, if a parameter is off from the designed value, a proper combination of the programmable circuit connections assigned to the parameter can be programmed for overcoming this problem.

Second Embodiment

Figure 3:
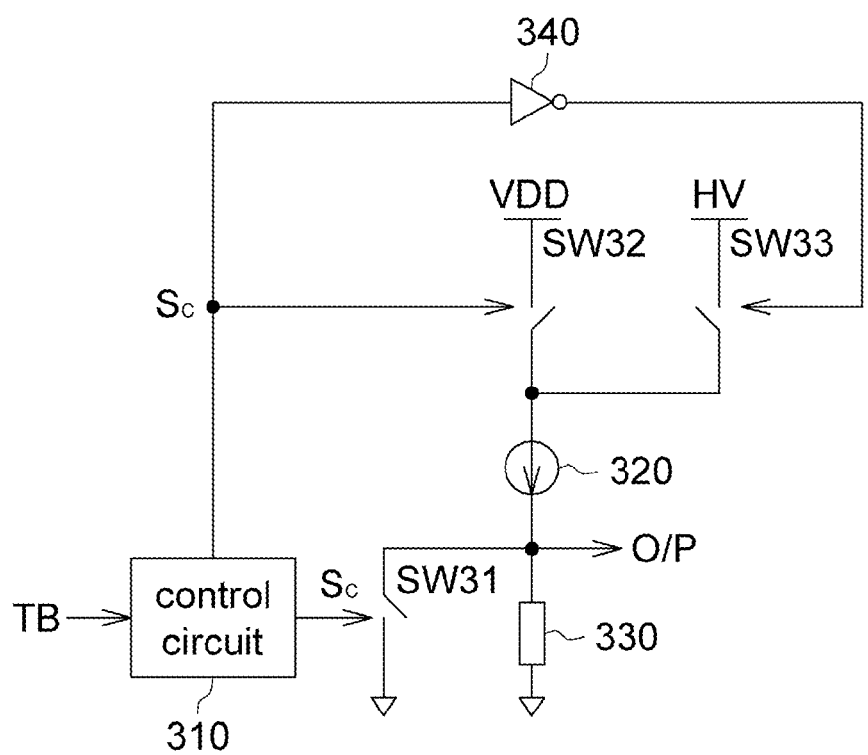
FIG. 3 shows a trim circuit according to a second embodiment of the disclosure.

FIG. 3 shows a trim circuit according to a second embodiment of the disclosure. The trim circuit according to the second embodiment includes a control circuit 310, a current source 320, a programmable circuit connection 330, a logic circuit 340 and switches SW31~33. The programmable circuit connection 330 in the second embodiment is for example but not limited to a capacitance type antifuse.

The control circuit 310 controls the conduction states of the switches SW31~33 and therefore the state of the antifuse 330 is corresponding to the trim bit TB.

The current source 320 provides a constant current to the antifuse 330. The current source 320 is also small size.

The control circuit 310 controls the conduction states of the switches SW31~SW33 to determine whether the antifuse 330 is programmed or unprogrammed. In the second embodiment, for example but not limited, the conduction state of the switches SW31~SW32 is opposite to the conduction state of the switch SW33.

The logic circuit 340 in the second embodiment is for example but not limited by an inverter. The logic circuit 340 inverts the control signal $S_C$ from the control circuit 310 and provides the inverted control signal to the switch SW33. The control signal $S_C$ is also provided to the switch SW31. In other words, the switches SW32 and SW33 have opposite conduction states.

The switch SW31 is selectively coupled between the output 0/P and ground. If the antifuse 330 is to be programmed, the switch SW31 is non-conducted and vice versa. The switch SW32 is selectively coupled between the operation voltage VDD and the current source 320. In other words, the switch SW32 is coupled between the operation voltage VDD and the antifuse 330. If the antifuse 330 is to be programmed, the switch SW32 is non-conducted and vice versa. The switch SW33 is selectively coupled between the programming voltage HV and the current source 320. In other words, the switch SW33 is coupled between the programming voltage HV and the antifuse 330. If the antifuse 330 is to be programmed, the switch SW33 is conducted and vice versa.

When the trim bit TB representing the antifuse 330 is unprogrammed (i.e. in open circuit connection), the control circuit 310 controls the switches SW31 and SW32 in the conducted state and controls the switch SW33 in the non-conducted state. Accordingly, the operation voltage VDD is coupled the antifuse 330 due to the conducted switches SW32 and SW31, but the programming voltage HV is not applied to the antifuse 330 because of the non-conducted switch SW33. Because the antifuse 330 is applied by the operation voltage lower than the threshold value, the antifuse 330 is unprogrammed.

When the trim bit TB indicates that the antifuse 330 is to be programmed (i.e. in short circuit connection), the control circuit 310 controls the switches SW31 and SW32 in the non-conducted state and controls the switch SW33 in the conducted state. Accordingly, the operation voltage VDD is not applied to the antifuse 330 but the programming voltage HV is applied to the antifuse 330 via the conducted switch SW33. Because the antifuse 330 is applied by the programming voltage HV (>25V) higher than the threshold value, the antifuse 330 is programmed.

Although FIG. 3 shows only one antifuse 330, the second embodiment is not limited. The trim circuit may include a plurality of parallel antifuses 330 and the program state of each antifuse is independently controlled by the control circuit 310.

In the above embodiments of the disclosure, in order to program the capacitance type programmable circuit connection, a high voltage is enough and thus neither high external current nor large external current source is required. Further, in order to program the capacitance type programmable circuit connection, no pad is required. Thus the circuit size of the trim circuit according to the above embodiments of the disclosure is small.

It will be appreciated by those skilled in the art that changes could be made to the disclosed embodiments described above without departing from the broad inventive concept thereof. It is understood, therefore, that the disclosed embodiments are not limited to the particular examples disclosed, but is intended to cover modifications within the spirit and scope of the disclosed embodiments as defined by the claims that follow.

What is claimed is:

1. A trim circuit for a power supply controller, comprising:
   a control circuit;
   at least a capacitance type programmable circuit connection; and
   a switching circuit, under control of the control circuit, the switching circuit selectively coupling the capacitance type programmable circuit connection to any one of an operation voltage and a programming voltage, for determining a programming state of the capacitance type programmable circuit connection, the switching including:
   a first switch selectively coupling the capacitance type programmable circuit connection to the programming voltage; and
   a second switch selectively coupling the capacitance type programmable circuit connection to the operation voltage;
   wherein the control circuit causes the first switch to be in a conduction state opposite to the second switch at all times, and the trim circuit further comprises:
   a current source, coupled between the operation voltage and the second switch, for constantly providing a reference current to the capacitance type programmable circuit connection.

2. The trim circuit according to claim 1, wherein the capacitance type programmable circuit connection includes a capacitance type antifuse.

3. The trim circuit according to claim 1, wherein the switching circuit includes a third switch, a fourth switch and a fifth switch,
   the third switch selectively coupled between an output and a reference voltage;
   the fourth switch selectively coupling the capacitance type programmable circuit connection to the operation voltage; and
   the fifth switch selectively coupling the capacitance type programmable circuit connection to the programming voltage.

4. The trim circuit according to claim 3, further comprising a current source, coupled between the operation voltage and the capacitance type programmable circuit connection or coupled between the programming voltage and the capacitance type programmable circuit connection, for providing a reference current to the capacitance type programmable circuit connection.

5. The trim circuit according to claim 3, wherein the capacitance type programmable circuit connection includes a capacitance type antifuse.

\* \* \* \* \*